(12) United States Patent
Reid et al.

(10) Patent No.: US 11,226,203 B2
(45) Date of Patent: Jan. 18, 2022

(54) LOW COST INS

(71) Applicant: Commonwealth Scientific and Industrial Research Organisation, Acton (AU)

(72) Inventors: Peter Reid, Acton (AU); John Malos, Acton (AU); Mark Dunn, Acton (AU); Alexander Pitt, Acton (AU)

(73) Assignee: COMMONWEALTH SCIENTIFIC AND INDUSTRIAL RESEARCH ORGANISATION, Acton (AU)

( * ) Notice: Subject to any disclaimer, the term of this patent is extended or adjusted under 35 U.S.C. 154(b) by 91 days.

(21) Appl. No.: 16/497,627

(22) PCT Filed: Mar. 28, 2018

(86) PCT No.: PCT/AU2018/050287
§ 371 (c)(1),
(2) Date: Sep. 25, 2019

(87) PCT Pub. No.: WO2018/176092
PCT Pub. Date: Oct. 4, 2018

(65) Prior Publication Data
US 2020/0033131 A1    Jan. 30, 2020

(30) Foreign Application Priority Data

Mar. 31, 2017  (AU) .............................. 2017901179
Sep. 25, 2017  (AU) .............................. 2017232241

(51) Int. Cl.
*G01C 21/20* (2006.01)
*B81B 7/02* (2006.01)
(Continued)

(52) U.S. Cl.
CPC ................ *G01C 21/20* (2013.01); *B81B 7/02* (2013.01); *G01C 21/18* (2013.01); *G05D 1/027* (2013.01); *G05D 2201/021* (2013.01)

(58) Field of Classification Search
CPC combination set(s) only.
See application file for complete search history.

(56) References Cited

U.S. PATENT DOCUMENTS

| 9,863,783 B1* | 1/2018 | Ledroz ................. E21B 47/022 |
| 2005/0022402 A1* | 2/2005 | Ash ....................... E21B 47/022 33/321 |

(Continued)

FOREIGN PATENT DOCUMENTS

| RU | 2265531 C2 | 10/2005 |
| WO | 2018/176092 A1 | 10/2018 |

OTHER PUBLICATIONS

Yongjian, Z., et al. "Detection methods of earth's rotation rate with a MEMS gyroscope", 2015 IEEE 12th international conference on Electronic Measurement & Instruments Jul. 2015 (Year: 2015).*

(Continued)

*Primary Examiner* — Aniss Chad
*Assistant Examiner* — Christopher George Fees
(74) *Attorney, Agent, or Firm* — Kilpatrick Townsend & Stockton LLP

(57) ABSTRACT

This disclosure relates to an underground mining vehicle comprising a three-axis MEMS gyroscope rotatable about a rotation axis and a gyroscope interface that calculates a first rotation rate bias with respect to a first axis different to the rotation axis, a second rotation rate bias with respect to a second axis different to the first axis and different to the rotation axis, a rotation rate about the rotation axis based on the Earth rotation rate vector by correcting the rotational measurement data using the first rotation rate bias and the second rotation rate bias and a third rotation rate bias with (Continued)

respect to the rotation axis based on the calculated rotation rate about the rotation axis. A navigation unit receives the first rotation rate bias, the second rotation rate bias and the third rotation rate bias and calculates a pose of the vehicle.

16 Claims, 5 Drawing Sheets

(51) Int. Cl.
  *G01C 21/18* (2006.01)
  *G05D 1/02* (2020.01)

(56) References Cited

U.S. PATENT DOCUMENTS

| | | | | |
|---|---|---|---|---|
| 2008/0039991 A1* | 2/2008 | May | ............. | G05D 1/0278 701/25 |
| 2013/0211723 A1* | 8/2013 | Weston | ............. | G01P 21/00 702/6 |

OTHER PUBLICATIONS

International Search Report and Written Opinion for PCT/AU2018/050287 dated Jun. 12, 2018, all pages.

International Preliminary Report on Patentability for PCT/AU2018/050287 dated Jan. 17, 2019, all pages.

Prikhodko, I.P. et al., "What is MEMS Gyrocompassing? Comparative Analysis of Maytagging and Carouseling", IEEE Journal of Microelectromechanical Systems, vol. 22, No. 6, Dec. 2013, Abstract, Section I-III.

Yongjian, Z., et al. "Detection methods of earth's rotation rate with a MEMS gyroscope", 2015 IEEE 12$^{th}$ International Conference on Electronic Measurement & Instruments Jul. 2015, [retrieved from internet on Jun. 8, 2018] <URL https://ieeexplore.ieee.org/stamp/stamp.jsp?tp=&arnumber=7494470>Section I-IV.

Russian Office Action and Examination Report dated Aug. 11, 2021 for Appln. No. 2019134846, all pages.

\* cited by examiner

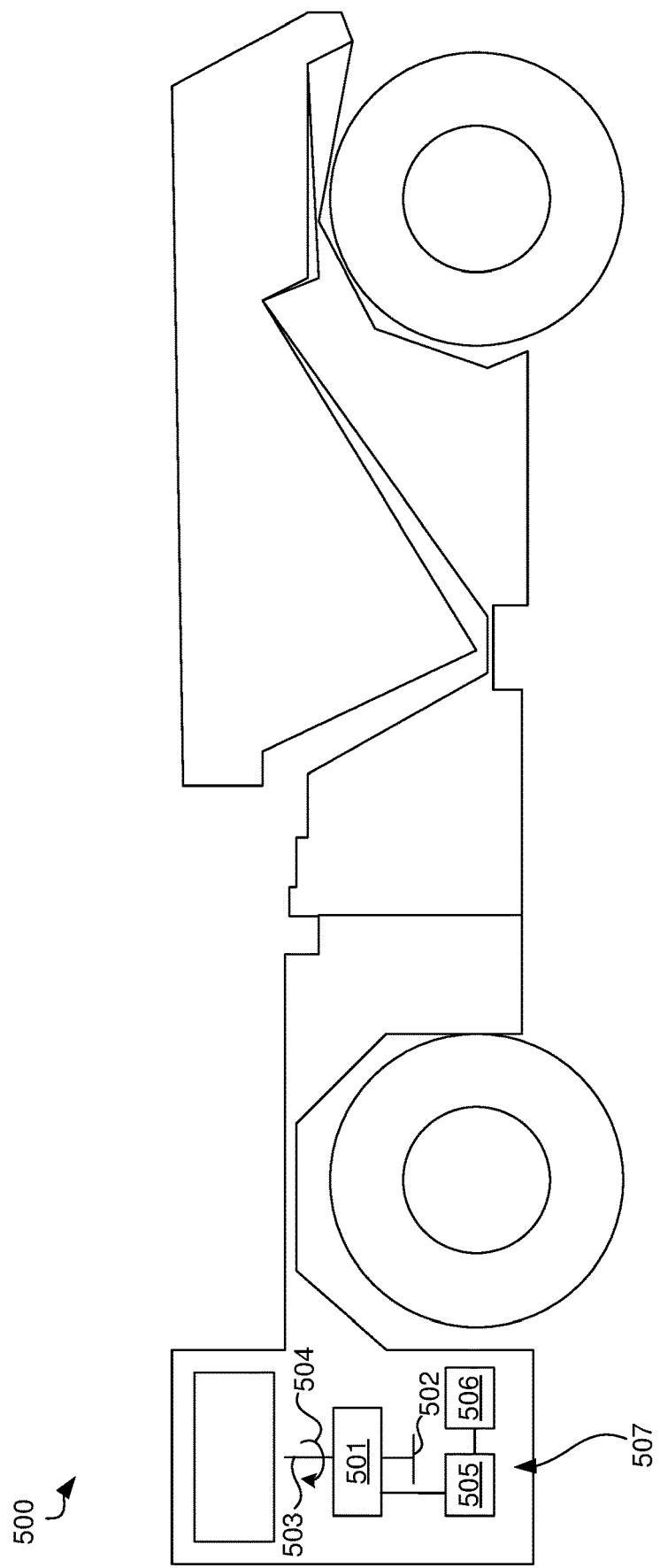

LOW COST INS

CROSS-REFERENCE TO RELATED APPLICATIONS

The present application claims priority from Australian provisional application 2017901179 and Australian complete application 2017232241 the content of both of which is incorporated herein by reference.

TECHNICAL FIELD

This disclosure relates to inertial navigation systems and methods.

BACKGROUND

Navigation is a fundamental process performed in moving vehicles and broadly comprises the determination of the current position and pose of the vehicle with reference to a global reference frame such that a direction or path can be determined towards a target position or along a target path. Some navigation methods rely on reference information, such as stars, landmarks or satellites (GNSS). In some applications, however, such as underground mining, such reference information are not always available. Therefore, the navigation unit of the vehicle often navigates based on dead reckoning. This involves determining the speed and direction of travel of the vehicle and then adding the corresponding vector to the current position to project to a new position.

While the current speed or acceleration can be determined relatively accurately it is generally difficult to determine the north direction. Accelerometers are available that are sufficiently accurate to determine the local vector direction of acceleration due to plumb-bob gravity of the Earth (or "gravity vector" for shorthand), which is the combination of accelerations due to gravity and centripetal rotation of the Earth, and equivalent to the surface normal of a locally horizontal surface (or "local level" for shorthand). FIG. 1 illustrates the Earth 100 rotating about north axis 101 as indicated by arrow 102. A vehicle 103 is located on the Earth 100, not to scale. FIG. 1 shows the vehicle reference frame 105 comprising x-axis 106, y-axis 107 and z-axis 108. Assuming vehicle 103 is level, the z-axis represents the surface normal, which means the only unknown in the pose of vehicle 103 is a rotation of reference frame 105 about the z-axis. The process of determining that rotation or in other words determining the direction of the y-axis 107 (or x-axis 106) is referred to as north-finding. Gyroscopes can be useful in north-finding if they are sufficiently accurate to detect the rotation rate of the Earth. Based on the vector quantity of the rotation rate of the Earth (or "rotation rate vector" for shorthand) together with the locally measured gravity vector, the orientation of the local reference frame 105 in relation to the Earth's reference frame can be fully determined. This allows steering the vehicle into a desired direction, such as due North or any other heading.

"Compact North Finding System" by Bojja et al. in IEEE Sensors Journal, 16/8, 2016 discloses a North Finding System comprising a 2-axis MEMS accelerometer and a 1-axis fibre optic gyroscope (FOG) rate sensor. The advantage of FOGs is that they have good accuracy but their disadvantage is that their fibre optical components are difficult to manufacture, which makes these devices expensive.

SUMMARY

This disclosure provides a north-finding system using three-axis MEMS gyroscopes. The system allows to perform a correction process that estimates the rotation rate bias in all three axes and uses this rotation rate bias to correct for the inaccuracies inherent in low-cost MEMS gyroscopes.

MEMS stands for micro-electro-mechanical systems and in general are systems with a size between 20 micrometers to one millimetre and include electronic components as well as mechanical components. In the case of MEMS gyroscopes, there are mechanical components, such as vibrating masses, as well as electronic components that detect the out-of-plane vibration of the vibrating masses. The mechanical components and the electronic components are generally fabricated as an integrated structure. For example, the weights are fabricated, such as by milling or etching, on the same silicon substrate on which the electronics components are fabricated, such as by lithography.

The underground mining vehicle may include a longwall miner (including the associated rail, roof supports, drives, conveyor, stage loader and crusher), a continuous miner, a road header; a loader, a hauler, a personnel carrier, a rescuer, a shuttle car; a flexible conveyor train; a plough, or any other machine equipment with or without an extraction device to remove material from the mine.

The underground mining vehicle comprises:

a three-axis MEMS gyroscope mounted on a rotator configured to rotate the three axis MEMS gyroscope about a rotation axis into multiple different orientations;

a gyroscope interface connected to the three-axis MEMS gyroscope configured to receive rotational measurement data from the three-axis MEMS gyroscope for the multiple different orientations and further configured to calculate a first rotation rate bias of the three-axis MEMS gyroscope with respect to a first axis different to the rotation axis based on the rotational measurement data, calculate a second rotation rate bias of the three-axis MEMS gyroscope with respect to a second axis different to the first axis and different to the rotation axis based on the rotational measurement data, calculate a rotation rate about the rotation axis based on the Earth rotation rate vector by correcting the rotational measurement data using the first rotation rate bias and the second rotation rate bias; and calculate a third rotation rate bias of the three-axis MEMS gyroscope with respect to the rotation axis based on the calculated rotation rate about the rotation axis; and a navigation unit connected to the gyroscope interface configured to receive the first rotation rate bias, the second rotation rate bias and the third rotation rate bias from the gyroscope interface, and calculate a pose of the underground mining vehicle based on the Earth rotation rate vector, the first rotation rate bias, second rotation rate bias and third rotation rate bias.

It is an advantage that the structure of MEMS gyroscopes lends itself to mass manufactured in a semiconductor process, which makes them significantly less expensive than fibre optic gyroscopes (FOG). This allows a broader range of applications for MEMS. Further, using a gyroscope with three axes, the pose can be continuously maintained during motion. More particularly, the three-axis MEMS gyroscope is rotated about the rotation axis to calculate the first and second rotation rate biases. These biases can be used to calculate the bias about the rotation axis via inference using the statically sensed Earth rotation rate vector. This leads to a significantly more accurate calculation of the bias about the rotation axis than using other methods including iterative numerical optimisation methods. This compensates for the lower accuracy of MEMS gyroscopes and in particular, this addresses the problem of MEMS bias poor repeatability. Further, only a single rotation axis is required, which reduces the need for gimbals and other complex mechanical structures. At the same time, the rotation rate bias about the single rotation axis is determined accurately.

The underground mining vehicle preferably comprises a vehicle controller connected to a vehicle and configured to
  stop the vehicle;
  correct an inertial navigation system while the vehicle is stopped;
  cause the rotator to rotate the three-axis gyroscope while the vehicle is stopped;
  cause the gyroscope interface to calculate the first, second and third rotation rate biases; and
  resume movement of the vehicle based on the calculated pose.

The underground mining vehicle further preferably comprises a three-axis accelerometer communicatively coupled to the navigation unit, wherein the navigation unit is configured to calculate the pose based on acceleration data from the three-axis accelerometer.

The navigation unit preferably is an inertial navigation unit and is configured to determine an absolute location of the underground mining vehicle based on the pose.

The gyroscope interface preferably is further configured to calculate the third rotation rate bias by calculating a rotation rate about the rotation axis and calculating the third rotation rate bias based on the calculated rotation rate about the rotation axis and the Earth rotation rate vector.

Preferably, the gyroscope interface is further configured to calculate the rotation rate by correcting the rotational measurement data using the first rotation rate bias and the second rotation rate bias.

Preferably, the gyroscope interface is configured to calculate the rotation rate $\omega_{third}$ about the third rotation axis according to $\omega_{third}=\sqrt{\omega_{Earth}^2-\omega_{first}^2-\omega_{second}^2}$ where $\omega_{Earth}$ is the Earth rotation rate vector magnitude, $\omega_{first}$ is the rotation rate about the first rotation axis and $\omega_{second}$ is rotation rate about the second rotation axis corrected by the calculated first and second rotation rate bias, respectively.

Preferably, the underground mining vehicle further comprises a filter connected to the gyroscope interface and configured to continually track the third rotation rate bias.

Preferably, the underground mining vehicle further comprises a further three-axis MEMS gyroscope mounted in a fixed position and pose relative to the underground mining vehicle, wherein the navigation unit is connected to the further three-axis MEMS gyroscope and is configured to receive further rotational measurement data from the further three-axis MEMS gyroscope and to calculate the pose of the underground mining vehicle based on the further rotational measurement data.

It is an advantage to have a second fixed three-axis gyroscope running in "continuous integration mode", and being corrected by the rotating set particularly when the vehicle is stationary.

Preferably, the gyroscope interface is configured to calculate the rotation rate $\omega_{third}$ about the third rotation axis according to $\omega_{third}=\sqrt{\omega_{Earth}^2-\omega_{first}^2-\omega_{second}^2}$, is the Earth rotation rate vector magnitude, $\omega_{first}$ is the rotation rate about the first rotation axis and $\omega_{second}$ is rotation rate about the second rotation axis corrected by the calculated first and second rotation rate bias, respectively;

the underground mining vehicle further comprises a three-directional accelerometer communicatively coupled to the navigation unit and the navigation unit is configured to calculate the pose based on acceleration data from the three-directional accelerometer; and the underground mining vehicle further comprises a further three-axis MEMS gyroscope mounted in a fixed position and pose relative to the underground mining vehicle and the navigation unit is connected to the further three-axis MEMS gyroscope and is configured to receive further rotational measurement data from the further three-axis MEMS gyroscope and to calculate the pose of the underground mining vehicle based on the further rotational measurement data.

A method for calculating a pose of an underground mining vehicle comprises:
  rotating a three axis MEMS gyroscope about a rotation axis into multiple different orientations;
  receiving rotational measurement data from the three-axis MEMS gyroscope for the multiple different orientations;
  calculating a first rotation rate bias of the three-axis MEMS gyroscope with respect to a first axis different to the rotation axis based on the rotational measurement data;
  calculating a second rotation rate bias of the three-axis MEMS gyroscope with respect to a second axis different to the first axis and different to the rotation axis based on the rotational measurement data, and
  calculating a rotation rate about the rotation axis based on the Earth rotation rate vector by correcting the rotational measurement data using the first rotation rate bias and the second rotation rate bias; and
  calculating a third rotation rate bias of the three-axis MEMS gyroscope with respect to the rotation axis based on the calculated rotation rate about the rotation axis; and
  calculating a pose of the underground mining vehicle based on the Earth rotation rate vector, the first rotation rate bias, second rotation rate bias and third rotation rate bias.

Preferably, the method further comprises:
  stopping the vehicle;
  correcting an inertial navigation system while the vehicle is stopped;
  rotating the three-axis gyroscope while the vehicle is stopped;
  calculating the first, second and third rotation rate biases; and
  resuming movement of the vehicle based on the calculated pose.

Preferably, stopping the vehicle comprises stopping the vehicle for more than 10 seconds and less than 300 seconds before resuming movement of the vehicle.

Preferably, resuming movement of the vehicle comprises resuming movement for more than or equal to zero metres and less than 100 metres.

Preferably, the method further comprises calculating components of pose unrelated to heading based on acceleration data from a three-axis accelerometer.

Preferably, the method further comprises determining an absolute location of the underground mining vehicle based on the pose.

Preferably, the method further comprises calculating the third rotation rate bias by calculating a rotation rate about the rotation axis and calculating the third bias based on the calculated rotation rate about the rotation axis and the Earth rotation rate vector.

Preferably, calculating the rotation rate comprises correcting the rotational measurement data using the first rotation rate bias and the second rotation rate bias.

Preferably, calculating the rotation rate $\omega_{third}$ about the third rotation axis comprises calculating $\omega_{third} = \sqrt{\omega_{Earth}^2 - \omega_{first}^2 - \omega_{second}^2}$, where $\omega_{Earth}$ is the Earth rotation rate vector magnitude, $\omega_{first}$ is the rotation rate about the first rotation axis and $\omega_{second}$ is rotation rate about the second rotation axis corrected by the calculated first and second rotation rate bias, respectively.

Preferably, the method further comprises continually tracking the first, second and third rotation rate bias.

There is provided use of a three-axis MEMS gyroscope for vehicle navigation by rotating the three-axis MEMS gyroscope, calculating three axis rate bias based on the Earth rotation rate vector and calculating a pose of the vehicle based on the Earth rotation rate vector and the three axis rotation rate bias.

Optional features described of any aspect of vehicle or method, where appropriate, similarly apply to the other aspects also described here.

Figure 2A:
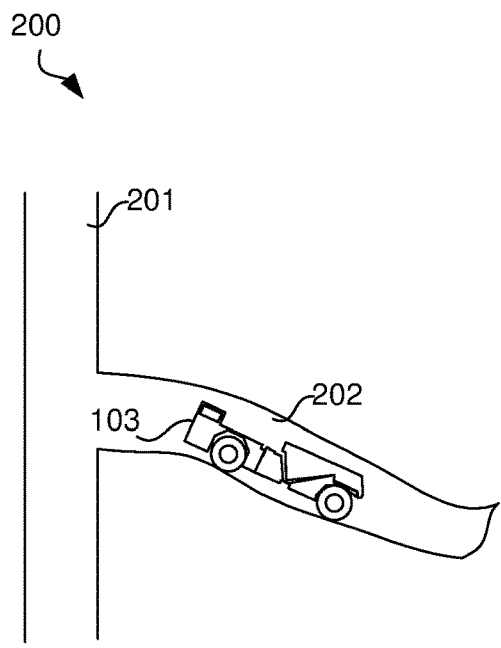

An example will be described with reference to the following Figures:

FIG. 2a schematically illustrates an underground mine.

Figure 2B:
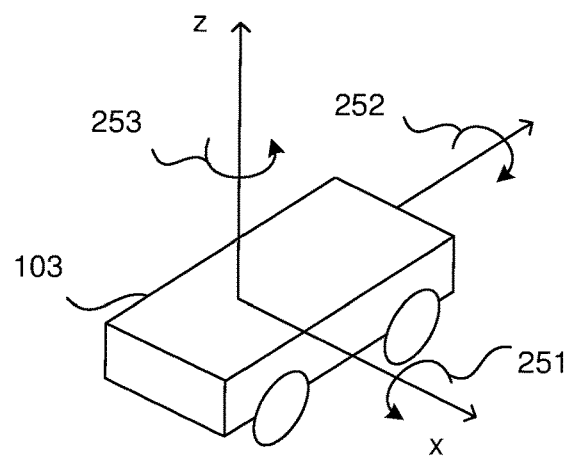
Figure 3A:
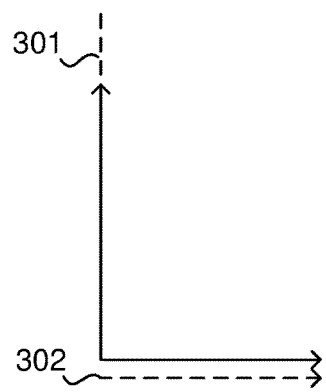
Figure 3C:
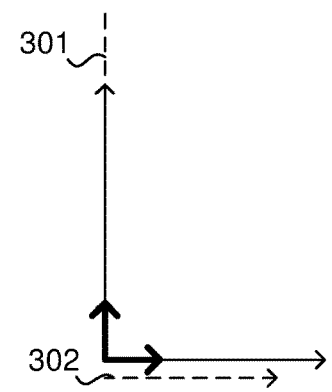
Figure 3B:
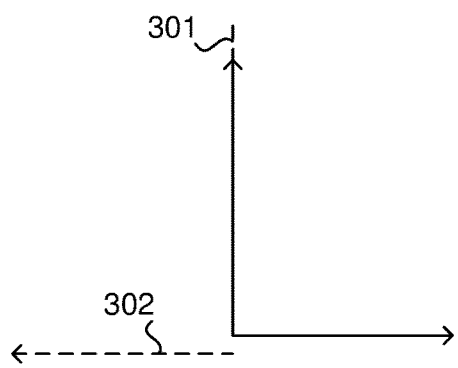
Figure 3D:
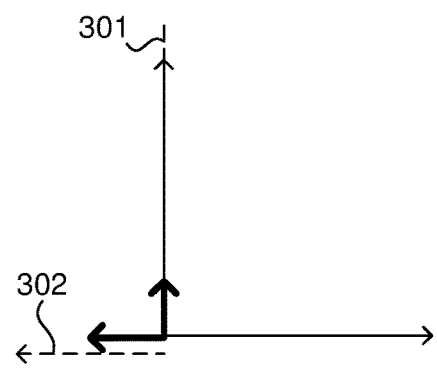
Figure 4A:
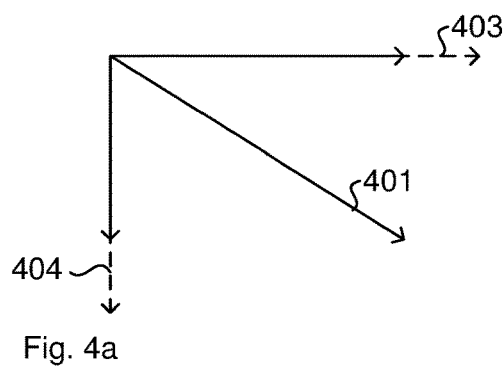
Figure 4B:
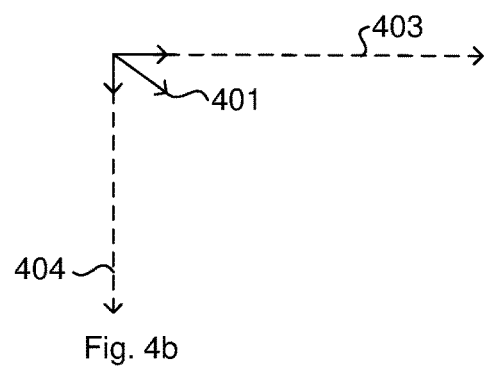
Figure 4C:
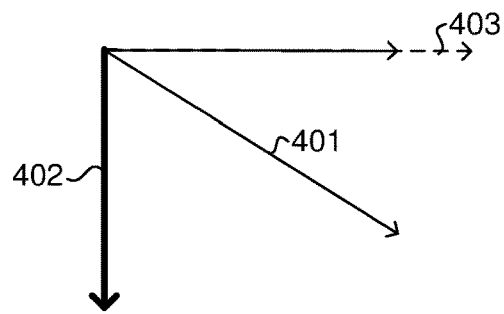
Figure 4D:
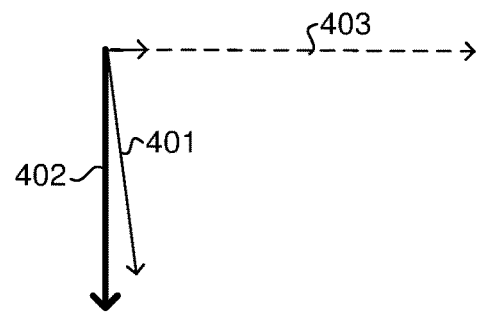

FIG. 2b illustrates the primary measurements of yaw, pitch and roll.

FIGS. 3a, 3b, 3c and 3d illustrate the maytag principle.

FIGS. 4a, 4b, 4c and 4d illustrate a maytag Earth rotation axis singularity.

FIG. 5 illustrates an underground mining vehicle.

Figure 6:
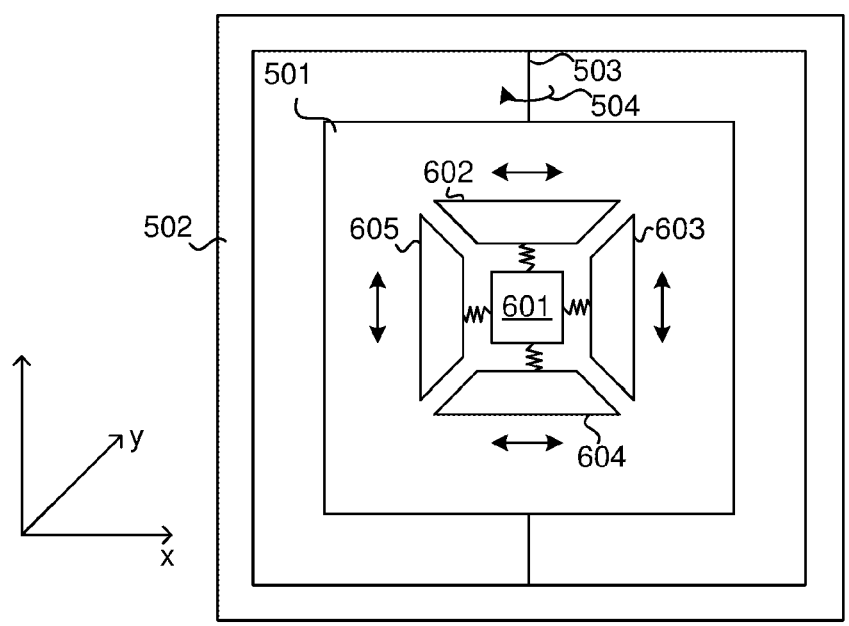

FIG. 6 illustrates three-axis MEMS gyroscope.

Figure 7:
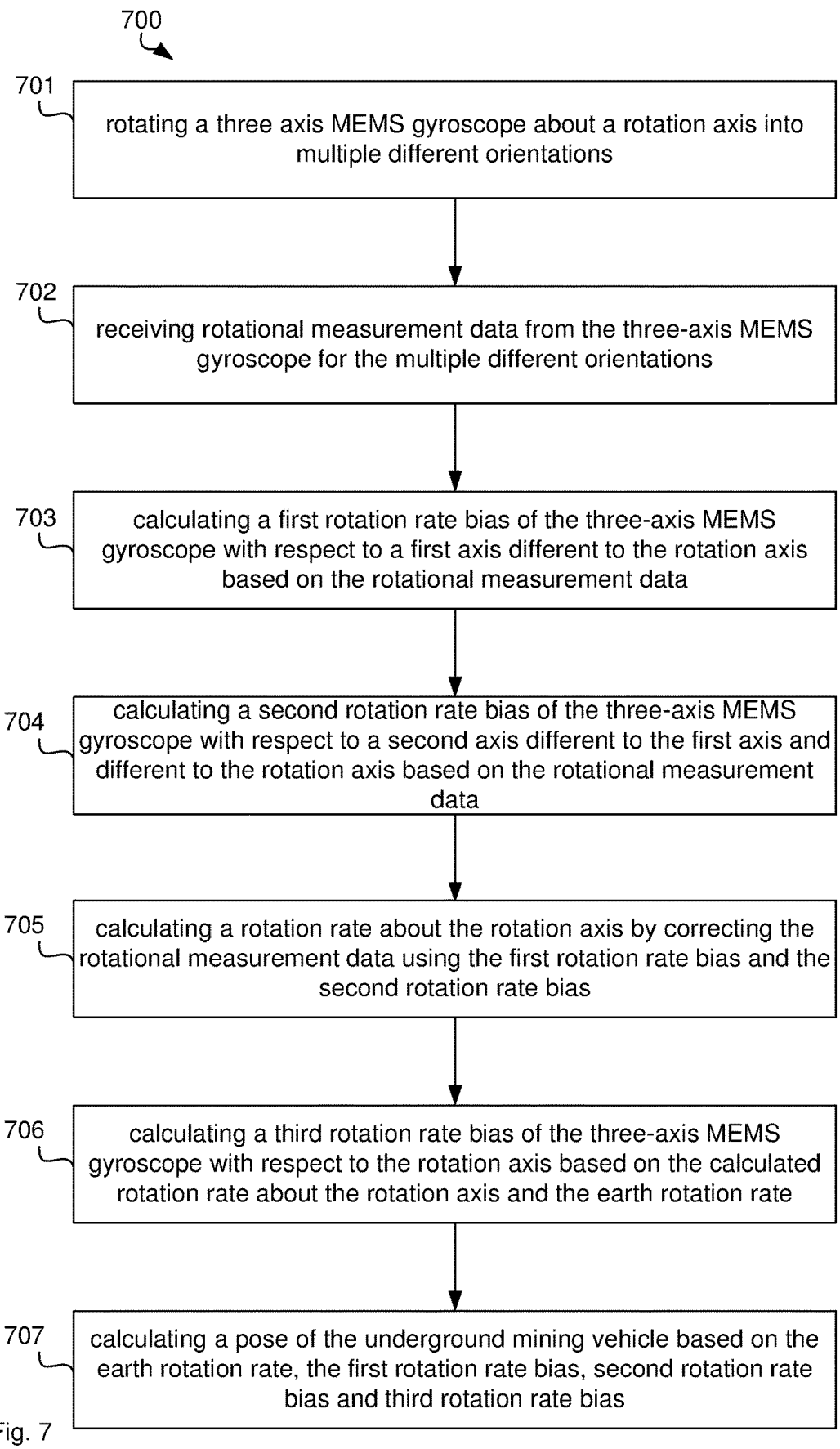

FIG. 7 illustrates a method for calculating the pose of an underground mining vehicle.

DESCRIPTION OF EMBODIMENTS

Figure 1:
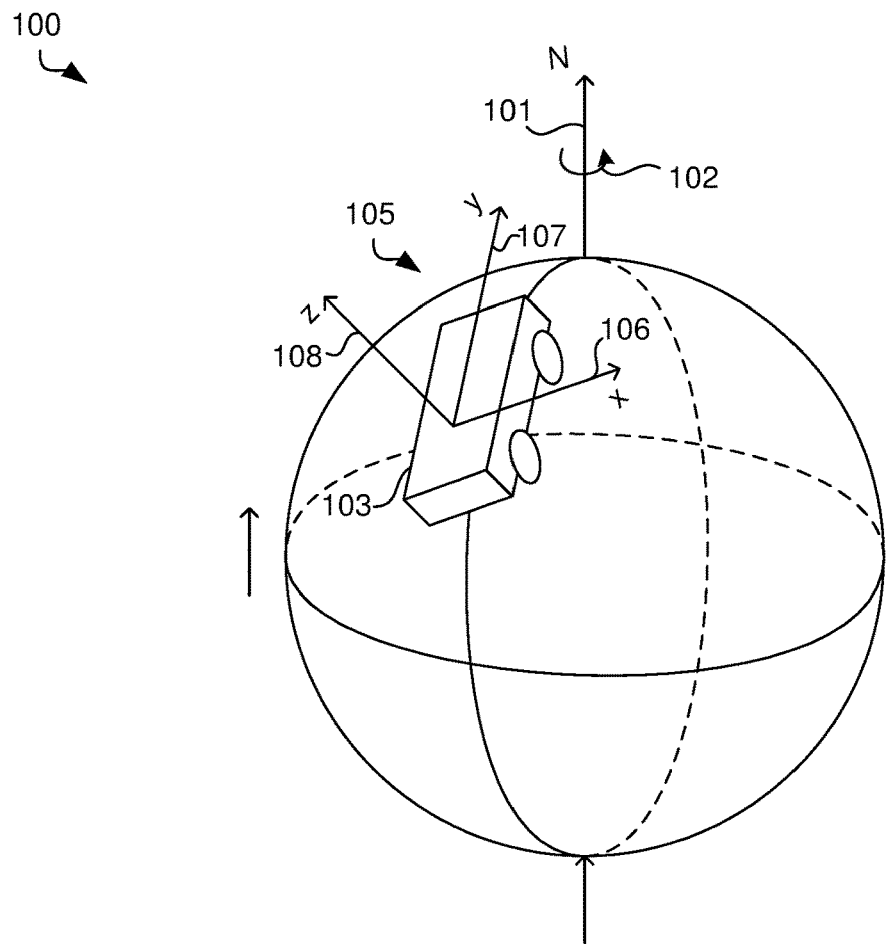
FIG. 1 illustrates the local reference frame of a vehicle on Earth according to the prior art.

North-finding, or more technically, gyrocompassing, is a capability of a sufficiently sensitive and accurate gyroscope (or 'gyro' for shorthand) to be able to detect the rotation rate of the Earth present in any observation frame 105 that is fixed relative to the rotating Earth 100. Furthermore, this quantity is often represented as a vector quantity, which incorporates the rotation rate magnitude as the vector magnitude, the axis of rotation 101 as the vector direction, and the direction of rotation 102 using the Right-hand rule to define direction of rotation about a vector. The Earth rotation rate axis 101 and direction are ostensibly fixed relative to the surface of the Earth, such that the vector observed at the North Pole points directly up from the local level, directly down at the South Pole, and is parallel to the local level at the Equator as illustrated in FIG. 1. For a local observation of this vector, the direction can thus be used to "find north", hence the gyrocompassing action.

The magnitude of this vector represents the rotation rate of the Earth, and is 7.292×10-5 radians per second, or approximately 15.04 degrees per hour. The reason this is not exactly 15 degrees per hour, as might be expected for a 24 hour day, is to accommodate the orbit of the Earth around the Sun; the 15.00 degree per hour measures solar time, whereas the 15.04 degree per hour rate is the sidereal rate observed by inertial measurement systems.

The sensitivity of a gyro to be used for gyrocompassing however should be significantly better than this rate in order to be able to resolve the components of the Earth rotation rate vector. At the Equator, all of this observed rate is present in the local level horizontal components and thus represents the maximum achievable sensitivity. This declines with higher latitude (as the cosecant of the latitude) until very little component of the vector is in the horizontal plane when nearing the Poles. If the orientation of the vehicle reference frame 105 is not level and is able to approach either extreme (parallel or perpendicular to the Earth rotation rate vector) the north-finding sensitivity of the gyroscope can be highly variable.

FIG. 2a illustrates an underground mine 200 schematically. Underground mine 200 comprises a shaft 201 and an access ramp 202 and the mining vehicle 103 from FIG. 1. As can be seen in the figure, as underground mining vehicle 103 travels through access ramp 202, the pose of the mining vehicle changes. In some examples, the access ramp 202 is has a spiral shape which means the pose of the underground mining vehicle 103 changes significantly.

FIG. 2b illustrates an example pose of underground mining vehicle 103. In this example, the pose is described by the standard Euler angles routinely reported by inertial measurement systems (INS) to describe the orientation of the INS. Euler angles pitch 251, roll 252 and yaw 253 are defined about coordinate frame axes 'x', 'y', 'z', in that order, respectively. The order represents a chosen convention and uniquely defines the orientation of the INS relative to local level and geographic north. In other examples, however, a different choice of labels and conventions may equally be used.

North-Finding Sensitivity

Returning to the question of sensitivity, the precision of the direction of north for a given latitude using gyrocompassing is a function of the sensitivity of the gyro components in the sensing plane.

An approximation provides the expected precision of the bearing angle as a function of the noise on the gyro components:

$$\theta = \pm \arctangent\left(\frac{\delta}{15.04 \text{ degrees/hour}}\right)$$

where δ is the gyro rate uncertainty, in units of degrees per hour, and θ is the angular pointing precision that can be expected. Note that when the gyro rate uncertainty is equal to the Earth rotation rate, the precision is of order ±45 degrees, meaning that the measurement is unable to determine direction to within a compass quadrant. To achieve a precision of order 1 degree, the gyro rate uncertainty needs to be better than approximately 0.2 degrees/hour by this estimate.

MEMS Inertial Measurement Unit Specifications

With respect to north-finding applications, the most relevant aspects of an inertial measurement unit (IMU) specification are the gyro specifications. The strength of the locally measured gravity vector is generally large, 9.8 metres per second-squared, also referred to as 1 g, such that even an accelerometer uncertainty of order 10 milli-g (98 mm/s$^2$) represents a precision (for the determination of level) of order 0.5 degree. By contrast, a MEMS gyro with uncertainty of order ±20 degrees per hour can provide no better than ±50 degrees of pointing precision, which is insufficient for north-finding applications.

At this point some clarification of the various uncertainties in both accelerometers and gyros is warranted. Two key specifications are those of bias instability and bias repeatability. Bias on both accelerometers and gyros are the dominant uncertainties which serve to add either positive or negative signal to the measured signal, in ways that can be unpredictable. The bias may be compensated in some way in order to retrieve the signals that enable direction to be determined to the required precision. Bias instability refers to the ultimate stability of the bias when all other effects such as drift, and white noise are removed. This represents how stable the bias is, and how quickly it can be expected to change. A gyro with a bias instability of 0.05 degrees per hour can be expected to change no more quickly than this rate in an otherwise controlled environment, such as one which is temperature-stable. Bias repeatability however describes how repeatable the bias is under a host of controlling factors, such as turn-on repeatability, warm-up, temperature, and ageing. The bias instability may limit the change of bias in the absence of these factors, but otherwise this is normally swamped by the repeatability factors, and hence represents the functional limit. For a MEMS gyro with bias repeatability of no better than 20 degrees per hour, a small bias instability may not ensure pointing precision unless the repeatability is compensated through measurement or control. For reference, low-grade FOGs with very small fibre-optic loop areas demonstrate bias repeatability of order 2 degrees per hour.

As noted, in order to achieve FOG-grade pointing performance, the poorer bias repeatability specification should be compensated in some way. Two options are routinely considered; (1) temperature control, and (2) maytagging also known as indexing.

Temperature Control

Due to the nature of MEMS, these systems are very sensitive to changes in temperature, both of the unit as a whole, and within the unit in terms of temperature gradients. Temperature control is therefore performed in MEMS IMUs as part of the normal operation. The residual after this control is what is typically reported in the manufacturer specifications, so any further external compensation will need to dramatically improve upon the base specifications.

If the system is continuously kept at constant temperature, any changes from the initial power-on of the MEMS will eventually equilibrate and remain constant to within the fundamental stability limits, in the case of bias, the bias instability. Unless the bias is independently measured in this constant temperature state, even this value can therefore drift at the rate of the bias instability, such that with sufficient time, it may grow to limits specified by the repeatability.

Furthermore, this represents only one issue to address in temperature control of bias. Practically it may be very problematic to maintain constancy of temperature and temperature gradient in a MEMS in a real environment. Mechanisms to both heat and cool the MEMS may be used, or alternatively controlled at one extreme to which the heat gain/loss to the environment can be guaranteed allowing the use of only cooling/heating respectively. This adds bulk to an instrument and additional factors to ensure the temperature control can correctly operate.

Typically the unit will also be power-cycled so that warm-up transients will be present. Turn-on bias repeatability will further result in an unknown bias even if brought to the same temperature each time. Collectively, these issues make compensation of bias via this approach challenging. For this reason the second option of maytagging may be preferable.

Maytagging

This process refers to physically rotating a system by a precisely known amount about a chosen axis, the maytag axis in the presence of a known rotation rate signal, typically the Earth rotation rate. It is also referred to as 'indexing' in which the different rotated orientations represent different and precisely known indexed positions. Typically there are two positions that represent a precise 180 degree rotation. This process has the effect that any signals present in the axes perpendicular to the maytag axis will be sign-reversed. The mining vehicle 103 may remain static for the maytagging procedure.

In one example, the first axis, second axis and third (rotation) axis herein are perpendicular to each other and fixed in relation to the vehicle 103 or in a known orientation in relation to vehicle 103 such as the first axis being parallel to the forward direction of the vehicle 103, the first axis being parallel to the sideward direction of the vehicle 103 and the rotation axis being parallel to the vertical axis of the vehicle. However other orientations may be suitable and the three axes may not be exactly perpendicular but linearly independent. Similarly, the rotation may be about the rotation axis in 180 degree increments or 90 degree increments, such as in direction of the first and second axes, or any other step size as long as it results in linearly independent measurements.

FIGS. 3a, 3b, 3c and 3d illustrate the maytag principle. In positions 3a to 3d, the maytag axis is the vertical dashed line 301, the sense axis is the horizontal dashed arrow 302, the measured signals are the black arrows, and the biases are the thick arrows. In 3a and 3b there is no bias present so when the sense axis 302 is rotated 180 degrees about the maytag axis 301, the horizontal signal along this axis will be seen to change sign, but remain the same magnitude. Note that the vertical signal remains the same since there is no change about this direction. The same signals measured in 3c and 3d have bias present which move with the axes. The sense axis changes direction and the bias moves with this axis. Note again that the signal and bias about the maytag axis do not change. Thus in one position a larger signal is seen on the sense axis and the in the other position, smaller. The bias can thus be unambiguously inferred from the difference between both signals in each position. The bias on the maytag axis however remains unknown since this does not change. Note also that while north-finding is often the objective of the measurement of the Earth rotation rate, the Earth rotation rate itself is used as a reference signal to unmask the biases present in the system using the maytag principle as an intermediate step to the process of north finding.

In a 3D system, a single maytag axis can thus be used to infer the biases on the two other perpendicular axes. For example, maytagging about the x-axis can be used to resolve biases on the y-axis and z-axis, with the bias on the x-axis remaining unknown. In applications requiring full navigation solutions this may be inadequate since it is desirable that the signal is accurately known about all three axes in order to produce a solution. In the context of north-finding applications, it can be sufficient to use only two of three axes in order to determine the direction of north. There are however pathological cases using this approach.

Maytag Pathological Case—Earth Axis Alignment Singularity

FIGS. 4a, 4b, 4c and 4d illustrate a maytag Earth rotation axis singularity. Consider situations in which an instrument maytag axis is either aligned or not-aligned along the rotation rate vector of the Earth for a given location. In FIGS. 4a to 4d the sensed Earth rotation rate vector is shown in thin solid line 401, the maytag axis is the 'z' axis in thick line 402, and the 'x' and 'y' axes are dashed lines 403 and 404, respectively. To illustrate the 3D dependence, diagrams 4a to 4d are shown with 'bottom' (4a and 4b) and 'side' (4c and 4d) views, where bottom is viewed along the positive 'z' axis direction looking from below the x-y plane, and side is viewed along the negative 'x' axis looking onto the z-y plane. If signal is present on all axes as shown in the two views given by 4a and 4c, then the Earth rotation rate vector components in the x-y plane allows the angle to north to be readily measured, as previously described in FIG. 2. This will occur when the maytag axis is not aligned to the Earth rotation rate vector. However when the maytag axis is aligned close to this vector, the situation is similar to views given by 4b and 4d in which virtually no signal is present in the x-y plane. Hence the north-alignment is difficult to be determined as it becomes very noisy due to the signals in this plane being small and comparable to the gyro noise levels. This would not be a problem if the z-axis signal could be used, since the angles made in the other z-x and z-y planes could be referenced for north. However maytagging about the z-axis only provides knowledge of the signals in the x-y plane, and the unknown bias on the z-axis can completely obscure the true signal and hence north-direction.

This situation represents a pathological case for single-rotation-axis maytagging. When the system aligns the maytag axis with the Earth rotation rate vector, the precision degrades to the point of being unable to determine direction. This can occur at any latitude. For example if the operation is at the equator, the Earth rotation rate vector is horizontal and north-pointing. Any system with maytag axis direction aligned close to this direction cannot clearly resolve north. Similarly at some intermediate latitude, the Earth rotation rate vector will point north but be inclined to the local level by the current latitude. Any system with maytag axis aligned in this direction will prevent a bearing from being accurately obtained.

One final comment may be made with respect to this issue. As the alignment to the Earth rotation axis is approached, the quality of the bearing solution degrades. This in fact provides information that the alignment of the vehicle must therefore be close to north. While true, the problem remains of the precision of exactly how close the alignment is to north. This is not straightforwardly resolvable.

Exactly Vertical Pathological Case

Another situation arises when the vehicle is exactly level. This however does not have anything to do with shortcomings of single-rotation-axis maytagging; it is an issue that is present in all INS and is simply related to singularities inherent in defining bearing about the local vertical. The level of an instrument is measured using the IMU accelerometers, which unambiguously determine the direction of locally measured gravity vector, in the absence of other forces of motion or error sources in the instrument. When a system is very close to vertical, the same issue illustrated in FIG. 4 occurs, in this instance, with the locally measured gravity vector signal aligning to the vertical accelerometer axis. Here however, the direction of north determined by the instrument does not become undefined, but instead very sensitive to the inclination. The reported bearing can swing around the vertical depending upon the direction of inclination which can change direction significantly due to the small components of the gravity vector in the horizontal plane. To a large extent this can be simply circumvented by judicial choice of the definition of bearing.

Underground Mining Vehicle

FIG. 5 illustrates an underground mining vehicle 500 that comprises a three-axis MEMS gyroscope 501, mounted on a rotator 502. Rotator 502 is configured to rotate three axis MEMS gyroscope 501 about a rotation axis 503 into multiple different rotated orientations an indicated by arrow 504. Mining vehicle 500 further comprises a gyroscope interface 505 connected to three-axis MEMS gyroscope 501. Gyroscope interface 505 is configured to receive rotational measurement data from three-axis MEMS gyroscope 501 for the multiple different rotated orientations. The rotational measurement data may comprise a rotation rate measured by the gyroscope including a corresponding bias. For example, the rotational measurement data may comprise a currently measured rotation rate about the three axes of the three-axis gyroscope 501 and may be a data triple (w1, w2, w3) at each sampling time. It is noted that the rotational measurement data may also be pre-processed by the gyroscope 501, such as smoothed. In this sense, receiving rotational measurement data for the different rotated orientation means that a first data triple is received for a first orientation (such as 0 degrees), a second data triple is received at a second orientation (such as 90 degrees) and so on. Gyroscope interface 505 is further configured to calculate a first rotation rate bias of three-axis MEMS gyroscope 501 with respect to a first axis different to rotation axis 503 based on the rotational measurement data. Gyroscope interface 505 is also configured to calculate a second rotation rate bias of three-axis MEMS gyroscope 501 with respect to a second axis different to the first axis and different to rotation axis 503 based on the rotational measurement data and to calculate a third rotation rate bias of three-axis MEMS gyroscope 501 with respect to the rotation axis based on the first rotation rate bias, the second rotation rate bias and the Earth rotation rate vector.

One example for the MEMS gyroscope is the Apogee-A from SBG Systems, which reports a bias in-run instability of <0.08 degrees per hour.

Mining vehicle 500 further comprises a navigation unit 506 connected to gyroscope interface 505. Navigation unit 506 is configured to receive the first rotation rate bias, the second rotation rate bias and the third rotation rate bias as calculated by gyroscope interface 505. Navigation unit 506 is further configured to calculate a pose of underground mining vehicle 500 based on the Earth rotation rate vector, the first rotation rate bias, second rotation rate bias and third rotation rate bias.

When the term 'configured' is used, this may refer to a wide range of different ways to configure the system. For example, the rotator 502 may be a microprocessor, FPGA, ASIC or other configurable device that is programmed to rotate the gyroscope or may be a chassis and a motor that automatically rotates the gyroscope without further inputs. Similarly, the gyroscope interface and navigation unit 506 may be processors programmed to perform the described functions or may be an ASIC, FPGA or other configurable device configured to perform those functions. It is further noted that the rotator 502, gyroscope interface 505 and navigation unit 506 may be implemented across one or multiple hardware devices. In particular, rotator 502, gyroscope interface 505 and navigation unit 506 may be implemented on the same microprocessor using separate or overlapping programming code, processes or threads to represent of these units.

MEMS gyroscope 501, rotator 502, gyroscope interface 505, and navigation unit 506 together form a navigation system 507 that may be integrated into a single device and used on mining vehicles as well as civil construction vehicles and other applications with or without access to GPS signals.

MEMS Gyroscope

Further to the introduction of MEMS gyroscope above, FIG. 6 illustrates a three-axis MEMS gyroscope 501 in more detail. Gyroscope 501 comprises a central part 601 that holds the processing electronics and four proof weights 602, 603, 604 and 605. The proof weights 602, 603, 604 and 605 vibrate in the plane of the drawing as indicated by the arrows. When the vehicle 500 turns and the gyroscope is rotated, the proof weights 602, 603, 604 and 605 tend to maintain their plane of vibration while the gyroscope 501 itself is rotated. As a result, the proof weights 602, 603, 604 and 605 vibrate out of plane, which can be detected by capacitors (not shown). This capacitive measurement is indicative of the rate of rotation, which can be measured in units of degrees per second, radians per second or Hertz.

In some examples, MEMs sensors referenced herein may be single-axis systems each solely installed upon electronic circuit boards with supporting electronics. Three separate circuit boards are mounted on a common chassis such that any board sense axis is orthogonal to the other two. This forms a 3-axis cluster of single-axis sensors. Single-axis MEMS sensors are typically higher performance than three-axis MEMS sensors and can approach similar bias instability performance of FOGs.

Typically, almost every gyroscope has a bias, which is an additive error in the reported rotational rate. This bias can be different for different axes and can change over time, such as when the gyroscope changes temperature or with age.

One of the main factors that limits performance in MEMS gyroscopes is gyroscope Bias Instability, which refers to the ultimate stability of the bias when all other effects such as drift, and white noise are removed. This represents how stable the bias is, and how quickly it can be expected to change. A gyro with a bias instability of 0.05 degrees per hour can be expected to change no more quickly than this rate in an otherwise controlled environment. For comparison, the bias instability of a middle-grade to high-grade FOG may be 0.01 degrees per hour, whereas a middle-grade MEMS sensor may be 0.2 degrees per hour or higher.

Another limiting factor is Bias Repeatability, which describes how repeatable the bias is under a host of controlling factors, such as turn-on repeatability, warm-up, temperature, and ageing. The bias instability may limit the change of bias in the absence of these factors, but otherwise this is normally overwhelmed by the repeatability factors, and hence represents the functional limit. For a MEMS with bias repeatability of no better than 20 degrees per hour, a tiny bias instability will do little to ensure pointing precision unless the repeatability is somehow compensated through measurement or control. For reference, low-grade FOGs with very small fibre-optic loop areas demonstrate bias repeatability of order 2 degrees per hour, and middle-grade to high-grade FOGs demonstrate 0.01 degrees per hour.

Determining Third Axis Bias

In order to address bias issues, the gyroscope 501 may be rotated by a rotator 502 about the rotation axis 503. As noted above, the multiple rotated orientations about the rotation axis 503 allows the determination of the bias with respect to a first axis and second axis which are both perpendicular to each other and to rotation axis 503 that is parallel to the z-axis in FIG. 3. The examples provided herein refer to the x-axis as the "first axis", the y-axis as the "second axis" and the z-axis as the "third axis". It is noted, however, that the three axis may be permutated.

A constant rotation rate, such as the Earth's rotation when mining vehicle 500 is stopped, can be detected at a zero degree rotation orientation (or index position) and then again at 180 degree rotation orientation (or index position) about rotation axis 503. The difference measured between the two rotation rates on the first axis for the two rotated orientations is the bias of the first axis. Similarly, the difference measured between the two rotation rates on the second axis for the two rotated orientations is the bias of the second axis. More particularly, the measurements of the first axis when defined perpendicular to the direction of north 205 is given:

$$\omega(0)=\omega_h \cos a + b.$$

$$\omega(180)=-\omega_h \cos a + b.$$

where $\omega_h$ is the Earth's rotation rate at a given latitude, a is the azimuth angle (heading) of the first axis with respect to north, b is the gyroscope bias (null offset). Summing both terms results in the bias as $\omega(0)+\omega(180)=2b$. While this procedure can provide the bias in two axes, it is difficult to determine the bias in the third axis.

It is noted that in general, the Earth rotation rate, $\omega_e$, can be written in terms of the magnitude of the vector components as $\omega_e=\sqrt{\omega_x^2+\omega_y^2+\omega_z^2}$ where $\omega_x$, $\omega_y$, $\omega_z$ are the vector components of the Earth rotation rate vector measured along the gyro x, y and z axes respectively. Consequently, the rotation rate about the rotation axis (z-axis in this example) can be written as: $\omega_z=\sqrt{\omega_e^2-\omega_x^2-\omega_y^2}$. This can equally be applied to the bias, which means the rotation rate bias about the rotation axis can be calculated based on the biases about the x and y axes, respectively, and the Earth's rotation rate using the above equation for $\omega_z$. In one example, $\omega_x$ and $\omega_y$ in the above equation represent the corrected rotational measurement data after the removal of the calculated bias. The calculated rotation rate $\omega_z$ about the rotation axis can then be subtracted from the measured rotation rate about the rotation axis to calculate the rotation rate bias about the rotation axis.

Navigation unit 506 can then receive the rotation rate biases and calculate the pose of the vehicle 500 by subtracting the bias from the rate measurements and calculate the pose using the corrected rate measurements. This may involve reading acceleration sensors to determine the locally measured gravity vector, that is, the pose components related to pitch (251) and roll (252) without yaw (253). Navigation unit 506 can then calculate a direction cosine matrix (DCM) that mathematically embodies the complete 3-component pose orientation.

This technique allows the use of lower cost sensors for the purpose of adequately controlling the mining vehicle, such as longwall miners in terms of face alignment or autonomous navigation of other vehicles. In this mode, the vehicle utilises a 'Dead Reckoned' solution, which is an approximation of the true path by taking a number of linear subsamples of orientation and distance travelled. For example, projecting the current heading at 0.5 m increments will result in a profile that is substantially the same as the true path taken.

For a low accuracy IMU/INS, the computed heading drifts substantially during mining vehicle operations, and can change significantly during any power cycles or long periods of stationarity of the mining vehicle. This disclosure introduces a number of methods to correct these heading changes, and thus, improve the dead reckoned solution.

Bias Estimation and Tracking

Use of maytagging as explained above can correct bias errors on two of the three axes. This improves the accuracy of the sensor by an order of magnitude or more. These two measurements can provide enough information to perform azimuth calculations under ideal positions, however there is a wide range of exceptions. Bias estimation and tracking of the third (maytag) axis enables standard inertial navigation equations to be used on a sensor that normally would be too noisy to perform such calculations.

Back Correction

During periods of stationarity, the vehicle can more accurately calculate the bias on the individual sensors and thus calculate a more accurate estimation of heading. At the period after stopping motion, the vehicle can compare the calculated accurate heading with the heading prior to stationarity. If there is a difference, the vehicle can back propagate the differential to the profile generated to this point.

Discontinuous Segments

After a power down, or long period of stationarity, the heading calculated may be significantly different to the heading determined at the end of motion. In this case, the vehicle can apply a constant offset of the differential to the previous period of motion or to the current motion segment. The absolute profile will be corrected using the snapping process.

Zero Velocity Updating

It is noted that the disclosed north-finding solution can be combined with further techniques to increase the accuracy of inertial navigation, such as zero velocity updating. To that end, the underground mining vehicle 500 further comprises a vehicle controller that may be integrated with other components described herein. The vehicle controller is configured to stop the vehicle and correct the inertial navigation system while the vehicle is stopped based on knowledge that the vehicle velocity is zero. The vehicle controller also causes the rotator to rotate the three-axis gyroscope while the vehicle is stopped and cause gyroscope interface 505 to calculate the first, second and third rotation rate biases. Finally, the vehicle controller resumes movement of the vehicle based on corrections obtained from zero velocity updating and from the calculated rotation rate biases.

Bias Tracking Filter

It is further noted that vehicle 500 may further comprise a filter connected to the gyroscope interface 505 and configured to continually track the third rotation rate bias. The filter may compare the current value of the third bias to the previous values to ensure that there are no sudden jumps. In particular, when crossing a pathological pose, the tracking filter can ensure that the bias remains within a plausible band while the pose is in the pathological case. In one example, the tracking filter disables the bias calculations and extrapolates the bias until the vehicle exits the pathological pose angle.

Resolving Ambiguities

In some cases, there may be an ambiguity that arises from the inference of the bias on the non-gimballed z-axis (third axis). More particularly, the inference of the bias on the non-gimballed z-axis (third axis) is based on solving $\omega = \sqrt{\omega_e^2 - \omega_x^2 - \omega_y^2}$. This may provide for two roots of the equation and hence two candidate solutions, representing an ambiguity.

The gyroscope interface 505 may remove an initial estimate of the z-axis (third axis) bias such as during a calibration procedure from the measured z-axis (third axis). Gyroscope interface 505 then selects whichever candidate solution is closest to this estimate as the correct solution and thereby provides greatest accuracy since this solution is determined from accurate xy-axis (1st and 2nd axis) biases, measured as described above.

Furthermore, with this initial accurate measurement of the z-axis (third axis) bias, gyroscope interface 505 can track changes in the value thereafter by sufficiently regular pose estimations described herein.

Second MEMS Gyroscope

In one example, mining machine 500 comprises a second three-axis MEMS gyroscope mounted in a fixed position and pose relative to the vehicle 500. In this case, the navigation unit 506 is connected to the second three-axis MEMS gyroscope and is configured to receive second rotational measurement data from the second three-axis MEMS gyroscope. The navigation unit 506 can then calculate the pose of the underground mining vehicle based on the second rotational measurement data. This enables partitioning of function between the first and second three-axis MEMS gyroscopes, namely, the first produces bias estimations involving the use of maytagging as previously described, and the second permits continuous monitoring of the motion of the mining machine 500 with errors to be compensated by bias estimations from the first. Bias estimations from the first occurs at opportune times when mining machine 500 is stationary, however mining machine 500 is not constrained to be stationary to avoid corrupting bias estimations, as the second three-axis MEMS gyroscope provides continual tracking of pose. These partitioned roles may be interchanged. The additional data also introduces redundancy that can be used to minimise the error.

Method for Calculating a Pose

FIG. 7 illustrates a method 700 for calculating a pose of underground mining vehicle 500. The method may be performed by multiple units in cooperation, such that each unit performs certain steps of the method. In other examples, the method is performed by a single controller, such as a microprocessor that is programmed to perform method 700.

Method 700 commences by rotating 701 a three axis MEMS gyroscope about a rotation axis into multiple different orientations. Again, this may be performed by the microprocessor sending a signal to the rotator, such as a signal energising a step motor. The processor then receives 702 rotational measurement data from the three-axis MEMS gyroscope for the multiple different orientations. This allows the processor to calculate 703 a first rotation rate bias of the three-axis MEMS gyroscope with respect to a first axis different to the rotation axis based on the rotational measurement data and calculate 704 a second rotation rate bias of the three-axis MEMS gyroscope with respect to a second axis different to the first axis and different to the rotation axis based on the rotational measurement data.

Further, processor can now use the calculated first rotation rate bias and the second rotation rate bias to correct the rotational measurement data. Using the corrected data, processor calculates 705 a rotation rate about the rotation axis. Importantly, processor then calculates 706 a third rotation rate bias of the three-axis MEMS gyroscope with respect to the rotation axis based on the first rotation rate bias, the second rotation rate bias rate and the Earth rotation rate vector as described above. Finally, the processor calculates 707 a pose of the underground mining vehicle based on the Earth rotation rate vector, the first rotation rate bias, second rotation rate bias and third rotation rate bias.

As also described above, the processor may perform zero velocity updating by stopping the vehicle, correcting an inertial navigation system while the vehicle is stopped, rotating the three-axis gyroscope while the vehicle is stopped, calculating the first, second and third rotation rate biases; and resuming movement of the vehicle based on the calculated pose. In one example, stopping the vehicle comprises stopping the vehicle for more than 10 seconds and less than 300 seconds before resuming movement of the vehicle. In another example, stopping the vehicle comprises stopping the vehicle for more than 50 seconds and less than 200 seconds before resuming movement of the vehicle. In yet one example, stopping the vehicle comprises stopping the vehicle for more than 100 seconds and less than 170 seconds before resuming movement of the vehicle. Further, resuming movement of the vehicle may comprise resuming movement for more than or equal to zero metres and less than 100 metres, for example. In another example, resuming movement of the vehicle comprises resuming movement for less than 500 metres. In another example, resuming movement of the vehicle comprises resuming movement for less than 50 metres. In yet another example, resuming movement of the vehicle comprises resuming movement for less than 200 metres. In yet another example, resuming movement of the vehicle comprises resuming movement for less than 30 metres.

Vehicle Control

Once the pose of the vehicle is available, the vehicle controller adjusts the steering angle to direct vehicle 500 to a desired location within the underground mine. Further, based on a previous calibration to a fixed reference point, the underground mining vehicle 500 can use the inertial navigation unit to determine an absolute location of the underground mining vehicle based on the pose. That is, the navigation unit adds the pose vector scaled by the current speed to the current position. The mining vehicle 500 may also send the current position, pose and speed to an above ground control room where this data can be displayed to a remote operator.

It is noted that the navigation systems and methods disclosed herein may be used for navigation of machinery below the surface and underground mining equipment. This may include mining vehicles, shuttle cars, continuous miners, drills, drill alignments tools etc. in the area of mining, civil construction and others.

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive.

The invention claimed is:

1. An underground mining vehicle, comprising:
a three-axis MEMS gyroscope mounted in a fixed position and pose relative to the underground mining vehicle and mounted on a rotator having a single rotation axis configured to index the three axis MEMS gyroscope about the rotation axis into multiple different orientations;
a gyroscope interface connected to the three-axis MEMS gyroscope configured to receive rotational measurement data from the three-axis MEMS gyroscope for the multiple different orientations and further configured to:
in a first step:
calculate a first rotation rate bias of the three-axis MEMS gyroscope with respect to a first axis substantially orthogonal to the rotation axis based on the rotational measurement data,
calculate a second rotation rate bias of the three-axis MEMS gyroscope with respect to a second axis substantially orthogonal to the first axis and to the rotation axis based on the rotational measurement data,
calculate a corrected first rotation rate by correcting the rotational measurement data using the first rotation rate bias;
calculate a corrected second rotation rate by correcting the rotational measurement data using the second rotation rate bias;
in a second step after the first step:
calculate an expected rotation rate about the rotation axis by performing an arithmetic operation on the Earth rotation rate vector, known for a given location of the underground mining vehicle, the corrected first rotation rate and the corrected second rotation rate; and
in a third step after the second step:
calculate a third rotation rate bias of the three-axis MEMS gyroscope with respect to the rotation axis based on the calculated expected rotation rate about the rotation axis; and
a navigation unit connected to the gyroscope interface configured to
receive the first rotation rate bias, the second rotation rate bias and the third rotation rate bias from the gyroscope interface, and
calculate a pose of the underground mining vehicle based on the Earth rotation rate vector, the first rotation rate bias, second rotation rate bias and third rotation rate bias.

2. The underground mining vehicle of claim 1, further comprising a vehicle controller connected to the vehicle and configured to stop the vehicle;
correct an inertial navigation system while the vehicle is stopped;
cause the rotator to rotate the three-axis gyroscope while the vehicle is stopped;
cause the gyroscope interface to calculate the first, second and third rotation rate biases; and
resume movement of the vehicle based on the calculated pose.

3. The underground mining vehicle of claim 1, further comprising a three-axis accelerometer communicatively coupled to the navigation unit, wherein the navigation unit is configured to calculate the pose based on acceleration data from the three-axis accelerometer.

4. The underground mining vehicle of claim 1, wherein the navigation unit is an inertial navigation unit and is configured to determine an absolute location of the underground mining vehicle based on the pose.

5. The underground mining vehicle of claim 1, wherein the gyroscope interface is configured to calculate the expected rotation rate $\omega_{third}$ about the rotation axis according to $\omega_{third} = \sqrt{\omega_{Earth}^2 - \omega_{first}^2 - \omega_{second}^2}$ where $\omega_{Earth}$ is the Earth rotation rate vector magnitude, $\omega_{first}$ is the corrected first rotation rate about the first axis and $\omega_{second}$ is the corrected second rotation rate about the second axis corrected by the calculated first and second rotation rate bias, respectively.

6. The underground mining vehicle of claim 1, further comprising a filter connected to the gyroscope interface and configured to continually track the third rotation rate bias.

7. The underground mining vehicle of claim 1, further comprising a further three-axis MEMS gyroscope mounted in a fixed position and pose relative to the underground mining vehicle, wherein the navigation unit is connected to the further three-axis MEMS gyroscope and is configured to receive further rotational measurement data from the further three-axis MEMS gyroscope and to calculate the pose of the underground mining vehicle based on the further rotational measurement data.

8. The underground mining vehicle of claim 1, wherein the gyroscope interface is configured to calculate the expected rotation rate $\omega_{third}$ about the rotation axis according to $\omega_{third}=\sqrt{\omega_{Earth}^2-\omega_{first}^2-\omega_{second}^2}$, where $\omega_{Earth}$ is the Earth rotation rate vector magnitude, $\omega_{first}$ is the corrected first rotation rate about the first axis and $\omega_{second}$ is corrected second rotation rate about the second axis corrected by the calculated first and second rotation rate bias, respectively;

the underground mining vehicle further comprises a three-directional accelerometer communicatively coupled to the navigation unit and the navigation unit is configured to calculate the pose based on acceleration data from the three-directional accelerometer; and the underground mining vehicle further comprises a further three-axis MEMS gyroscope mounted in a fixed position and pose relative to the underground mining vehicle and the navigation unit is connected to the further three-axis MEMS gyroscope and is configured to receive further rotational measurement data from the further three-axis MEMS gyroscope and to calculate the pose of the underground mining vehicle based on the further rotational measurement data.

9. A method for calculating a pose of an underground mining vehicle, the method comprising:
indexing a three axis MEMS gyroscope mounted in a fixed position and pose relative to the underground mining vehicle about a single rotation axis into multiple different orientations;
receiving rotational measurement data from the three-axis MEMS gyroscope for the multiple different orientations;
in a first step:
calculating a first rotation rate bias of the three-axis MEMS gyroscope with respect to a first axis substantially orthogonal to the rotation axis based on the rotational measurement data;
calculating a second rotation rate bias of the three-axis MEMS gyroscope with respect to a second axis substantially orthogonal to the first axis and different to the rotation axis based on the rotational measurement data,
calculating a corrected first rotation rate by correcting the rotational measurement data using the first rotation rate bias;
calculating a corrected second rotation rate by correcting the rotational measurement data using the second rotation rate bias;

in a second step after the first step:
calculating an expected rotation rate about the rotation axis by performing an arithmetic operation on the Earth rotation rate vector, known for a given location of the underground mining vehicle, the corrected first rotation rate and the corrected second rotation rate; and in a third step after the second step:
calculating a third rotation rate bias of the three-axis MEMS gyroscope with respect to the rotation axis based on the calculated expected rotation rate about the rotation axis; and calculating a pose of the underground mining vehicle based on the Earth rotation rate vector, the first rotation rate bias, second rotation rate bias and third rotation rate bias.

10. The method of claim 9, further comprising:
stopping the vehicle;
correcting an inertial navigation system while the vehicle is stopped;
rotating the three-axis gyroscope while the vehicle is stopped;
calculating the first, second and third rotation rate biases; and
resuming movement of the vehicle based on the calculated pose.

11. The method of claim 10, wherein stopping the vehicle comprises stopping the vehicle for more than 10 seconds and less than 300 seconds before resuming movement of the vehicle.

12. The method of claim 10, wherein resuming movement of the vehicle comprises resuming movement for more than or equal to zero metres and less than 100 metres.

13. The method of claim 9, wherein the method further comprises calculating components of pose unrelated to heading based on acceleration data from a three-axis accelerometer.

14. The method of claim 9, wherein the method further comprises determining an absolute location of the underground mining vehicle based on the pose.

15. The method of claim 9, wherein calculating the expected rotation rate $\omega_{third}$ about the rotation axis comprises calculating $\omega_{third}=\sqrt{\omega_{Earth}^2-\omega_{first}^2-\omega_{second}^2}$, where $\omega_{Earth}$ is the Earth rotation rate vector magnitude, $\omega_{first}$ is the corrected first rotation rate about the first axis and $\omega_{second}$ is corrected second rotation rate about the second axis corrected by the calculated first and second rotation rate bias, respectively.

16. The method of claim 9, wherein the method further comprises continually tracking the first, second and third rotation rate bias.

* * * * *